(12) United States Patent
Flinsenberg et al.

(10) Patent No.: US 10,411,728 B2
(45) Date of Patent: Sep. 10, 2019

(54) DEVICE FOR AND METHOD OF DETERMINING CLUSTERS

(71) Applicant: KONINKLIJKE PHILIPS N.V., Eindhoven (NL)

(72) Inventors: Ingrid Christina Maria Flinsenberg, Eindhoven (NL); Marc Aoun, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 16/076,347

(22) PCT Filed: Feb. 8, 2017

(86) PCT No.: PCT/EP2017/052756
§ 371 (c)(1),
(2) Date: Aug. 8, 2018

(87) PCT Pub. No.: WO2017/137439
PCT Pub. Date: Aug. 17, 2017

(65) Prior Publication Data
US 2019/0044533 A1 Feb. 7, 2019

(30) Foreign Application Priority Data

Feb. 8, 2016 (EP) .................... 16154646

(51) Int. Cl.
*H03M 7/00* (2006.01)
*H03M 7/30* (2006.01)
(Continued)

(52) U.S. Cl.
CPC ........ *H03M 7/3071* (2013.01); *G06F 16/285* (2019.01); *G06F 17/18* (2013.01); *H03M 7/3059* (2013.01); *H03M 7/4012* (2013.01)

(58) Field of Classification Search
CPC ............ H03M 7/3071; H03M 7/3059; H03M 7/4012; G06F 17/18; G06F 16/285; G06F 17/30598
(Continued)

(56) References Cited

U.S. PATENT DOCUMENTS 7,174,343 B2 * 2/2007 Campos ............... G06K 9/6223
707/737
7,844,557 B2 * 11/2010 Acharya ............... G06F 16/285
706/45
(Continued)

FOREIGN PATENT DOCUMENTS

EP 2717475 A1 4/2014

OTHER PUBLICATIONS

Cardinal, Jean, "Quantization with an Information-Theoretic Distortion Measure", internet article, Oct. 31, 2003 (Oct. 31, 2003), XP002759319, Retrieved from the Internet: URL:http://citeseerx.ist.psu.edu/viewdoc/s ummary?doi=10.1.1.20.3058.
(Continued)

*Primary Examiner* — Linh V Nguyen (57) ABSTRACT

A device (100) for and method of determining clusters of sequences of instances of a first type of data for compacting a data set comprising sequences of instances of the first type of data is provided. Also a method of compacting a data set, a method of transmitting compacted data and a computer program product are provided. In a sequence clustering unit (110) of the device, sequences of a first set of data are clustered on basis of conditional probabilities. Each unique sequence of the first set of data is associated with one or more conditional probabilities that an instance of the second set of data has a specific value given the unique sequence.
(Continued)

In the clustering a significant part of the mutual information between the first set of data and the second set of data is maintained.

12 Claims, 4 Drawing Sheets

(51) Int. Cl.
  *G06F 16/28* (2019.01)
  *G06F 17/18* (2006.01)
  *H03M 7/40* (2006.01)

(58) Field of Classification Search
  USPC ...... 341/51, 79, 86, 87, 107; 706/45, 46, 47, 706/101, 102
  See application file for complete search history.

(56) References Cited

U.S. PATENT DOCUMENTS

| | | | | |
|---|---|---|---|---|
| 8,610,605 | B2* | 12/2013 | Froemmgen | H03M 7/4087 341/57 |
| 2003/0177000 | A1* | 9/2003 | Mao | G06F 17/2715 704/9 |
| 2005/0044487 | A1* | 2/2005 | Bellegarda | G06F 16/30 715/229 |
| 2005/0149495 | A1* | 7/2005 | Goldschlager | G06Q 10/08 |
| 2006/0004747 | A1* | 1/2006 | Weare | G06F 16/367 |
| 2006/0031217 | A1* | 2/2006 | Smith | G06K 9/00711 |
| 2006/0095521 | A1* | 5/2006 | Patinkin | G06Q 10/107 709/206 |
| 2007/0271292 | A1* | 11/2007 | Acharya | G06K 9/6219 |
| 2011/0035379 | A1* | 2/2011 | Chen | G06F 16/2462 707/740 |

OTHER PUBLICATIONS

Willems, P.M.J. et al., "The Context Tree Weighting Method: Basic Properties", internet article, May 31, 1995 (May 31, 1995), IEEE Transactions on Information Theory. vol. 41. No. 3. pp. 653-664, May 1995, XP002759320, Retrieved from the Internet:URL:http://www.cs.cmu.edu/~aarti/Class/10704_Springl5/CTW.pdf.

Murray, J.F., et al., "Machine Learning Methods for Predicting Failures in Hard Drives: A Multiple-Instance Application" Journal of Machine Learning Research 6 (2005) 783-816.

Begleiter, R. et al., "Superior Guarantees for Sequential Prediction and Lossless Compression via Alphabet Decomposition", Journal of Machine Learning Research 7 (2006) 379-411.

Kennedy, C.E. et al., "Time Series Analysis as Input for Clinical Predictive Modeling: Modeling Cardiac Arrest in a Pediatnc ICU", Kennedy and Turley Theoretical Biology and Medical Modelling 2011, 8:40 http://www.tbiomed.com/content/8/1/40.

Gao, Y. et al., "Estimating the Entropy of Binary Time Series: Methodology, Some Theory and a Simulation Study", Entropy 2008, 10, 71-99.

Belisle, C.J.P., et al., "Convergence Theorems for a Class of Simulated Annealing Algorithms on Rd" of Claude J. P. Bélisle, Journal of Applied Probability, vol. 29, No. 4 (Dec. 1992), pp. 885-895.

Willems, F. et al., "Reflections on the Context-Tree Weighting Method: Basic Properties", IEEE Information Theory Society Newsletter, vol. 47, No. 1, Mar. 1997.

* cited by examiner

DEVICE FOR AND METHOD OF DETERMINING CLUSTERS

FIELD OF THE INVENTION

The invention relates to a device for determining clusters of sequences of instances of a first type of data for compacting a data set comprising sequences of instances of the first type of data. The instances of the first type of data comprising information for predicting instance of a second type of data.

The invention further relates to a method of compacting a data set or a method transmitting compacted data. The invention also relates to the field of computer program products for determining clusters.

BACKGROUND OF THE INVENTION

In data storage and data transmission one of the challenges is to reduce the amount of data to be stored and the amount of data to be transmitted. If one is willing to accept that some data is lost, one may cluster instances of the data and represent the instances of the data that belongs to a single cluster with a shorter description that uniquely identifies the cluster and use the shorter descriptions instead of the longer instances of the data. Instead of "forming clusters of instances of the data" one may read grouping instances of the data, binning instances of the data or quantizing instances of the data. Representing the instances of the data with clusters is most useful if instances of the data having similar properties with respect to at least one characteristic end up in the same cluster.

If, for example, the instances of the data are used to predict an instance of another type of data, one would like to put instances of the data that most probably result in the same prediction in a single cluster. Thus, the clusters must be formed in such a way that the mutual information between the instances of the another type of data and the original instances of the data is maintained as far as possible in the process of clustering the instances of the data.

The paper "Quantization with an Information-Theoretic Distortion Measure" of Jean Cardinal discloses a method using a modification of Lloyd's algorithm for finding a quantizer of data X such that the mutual information between X and related Y does not much reduce as the result of the quantizing. The document "Quantization with an Information-Theoretic Distortion Measure", Jean Cardinal, Oct. 23, 2002, is published by the "Université Libre de Bruxelles" on the website http://www.ulb.ac.be/di/publications/RT_2002. html, and is also published on the website http://citeseerx.ist.psu.edu/viewdoc/summary-?doi=10.1.1.20.3058.

SUMMARY OF THE INVENTION

It is an object of the invention to provide a method of clustering sequences of instances of data that is efficient while still maintaining most of the mutual information between the sequences and instances of another type of data. The sequences are going to be used to predict instances of the another type of data.

For this purpose, according to an aspect of the invention, a device for determining clusters of sequences of instances of data of a first type of data for compacting a data set comprising sequences of instances of the first type of data is provided.

For this purpose, according to another aspect of the invention, a method of determining clusters of sequences of instances of data of a first type of data for compacting a data set comprising sequences of instances of the first type of data.

For this purpose, according to further aspects of the invention, a method of compacting a data set, a method of transmitting compacted data, and a computer program product for determining clusters are provided.

According to the aspect of the invention, the device for determining clusters of sequences of instances of a first type of data for compacting a data set comprising sequences of instances of the first type of data is provided. The instances of the first type of data comprise information for predicting instances of a second type of data. The instances of the second type of data comprise data based on a characteristic of a physical entity. The device comprises a first data set unit, a second data set unit, a sequence clustering unit and an output unit. The first data set unit obtains a first set of data comprising sequences of instances of the first type of data. The second data set unit obtains a second set of data comprising instances of the second type of data. Each instance of the second set of data corresponds to a sequence in the first set of data. The sequence clustering unit assigns the sequences of the first set of data to clusters. The assigning is based on conditional probabilities of data of the second type given a sequence of the first set of data, wherein each unique sequence of the first set of data is associated with one or more conditional probabilities that an instance of the second set of data has a specific value given the unique sequence. The output unit provides the clusters to, for example, a data reduction arrangement for compacting sequences of instances of the first type of data.

According to the another aspect of the invention, the method of determining clusters of sequences of instances of data of a first type of data for compacting a data set comprising sequences of instances of the first type of data. The instances of the first type of data comprise information for predicting instances of a second type of data. The instances of the second type of data comprise data being based on a characteristic of a physical entity. The method comprises: i) a first set of data comprising sequences of instances of the first type of data; ii) a second set of data comprising instances of the second type of data, each instance of the second set of data corresponds to a sequence in the first set of data; iii) assigning the sequences of the first set of data to clusters, the assigning is based on conditional probabilities of data of the second type given a sequence of the first set of data, wherein each unique sequence of the first set of data is associated with one or more conditional probabilities that an instance of the second set of data has a specific value given the unique sequence; iv) providing the clusters to, for example, a data reduction arrangement for compacting the sequences of instances of the first type of data.

The measures of the above described device and method have the effect that the clustering can be performed efficiently. The invention is based on the recognition that, if sequences of the first set of data that have a similar conditional probability end up in the same cluster, a large enough portion of the mutual information between the first set of data and the second set of data is maintained as mutual information between the clustered data and the second set of data. Determining the conditional probabilities can be performed efficiently with specific algorithms.

After the assigning to the clusters, each cluster represents the sequences of the first set of data that have a similar characteristic and, most probably, the sequences of the single cluster result in a similar prediction of an instance of the second type of data. It is the insight of the inventors that the particular conditional probability used in the clustering leads to this effect. Thus, the above discussed device and method cluster the sequences of the first set of data such that most of the mutual information is maintained and, thus, that identification of the clusters can be used instead of a complete sequence with instances of the first set of data to predict instance of the second set of data. It is further to be noted that other terms for clustering are grouping and binning.

Some sequences of the first set of data may be present more than once in the first set of data. Such duplicates may be represented by the unique sequence. Each unique sequence is associated with one or more conditional probabilities. Whether one or more conditional probabilities are associated with the unique sequence depends on the number of signs in the alphabet for instances of the second set of data. If the second set of data comprises, for example, only binary data, then the alphabet comprises only two signs and one knows immediately the distribution of the conditional probabilities if one conditional probability is known. For example, for a specific unique sequence, if the a first conditional probability of data of the second set of data is equal to a first sign of two given the specific unique sequence is known, then it is known what the distribution of the defined conditional probability is for the unique sequence, namely, the second conditional probability of data of the second set of data is equal to a second sign of two given the specific unique sequence is one minus the first conditional probability. Thus, then the unique sequence is only with one conditional probability. If the alphabet of the data of the second set of data has more signs, in order to know the distribution of the conditional probabilities, one has to know more conditional probabilities for the unique sequence.

The clustering of the sequences is performed on basis of the conditional probability. This means that sequences that have a conditional probability value that are close to each other, that are similar and/or that are equal to each other are put in the same cluster. Optionally, each cluster is associated with an interval between 0 and 1, the intervals of the clusters do not overlap, and wherein each cluster comprises sequences of the first set of data that have the above discussed conditional probability within the interval associated with the cluster. Please note that these intervals can also be used to compact data if new data arrives, because if new data arrives and if one is able to calculate conditional probabilities for the new data, one may represent this new data by the cluster that is associated with the interval in which the calculated conditional probability falls.

In an embodiment, the instance of the first type of data comprise data being derived from, e.g. being based on, sensor data.

Optionally, the assigning of the sequence of the first set of data to clusters comprises applying the Context Tree Weighting method to the first set of data and the second set of data to obtain a context tree. In the Context Tree Weighting method every unique sequence of the first set of data is represented by a path in the context tree from a root node to a specific leaf node and counts stored in the nodes of the context tree are based on the corresponding elements of the second set of data. Optionally, the clusters are formed on basis of the estimated conditional probabilities of the leaf nodes of the context tree. If a specific leaf node relates to a specific cluster, then all sequences of the first set of data that are equal to the unique sequence ending in the specific leaf node are assigned to the specific cluster. The estimated conditional probability of a respective leaf node is a Krichevsky and Trofimov estimator that is calculated on basis of the counts of the respective leaf node. Note that the Krichevsky and Trofimov estimator if often termed KT-estimator. It is further noted that, if the second set of data comprises only binary data, the KT-estimator is calculated by:

$$\frac{a+\frac{1}{2}}{a+b+1}$$

wherein a are the counted zero's in the respective leaf node and b are the counted one's in the respective leaf node. The inventors have found that an estimated conditional probability that is provided by the KT-estimator and that are based on the Context Tree Weighting method for the leaf nodes automatically provides an estimate for the conditional probability for data of the second set of data given the specific sequence. The Context Tree Weighting method provides an efficient way of generating the context tree and calculating the estimated conditional probabilities. Thus, this optional embodiment provides an efficient way of generating data that is used to cluster the sequence of the first set of data.

In general, each suitable algorithm for forming clusters may be used. Optionally, in an embodiment, a k-means algorithm is used to form the clusters. In the k-means algorithm, the conditional probability or the estimated conditional probabilities of the leaf nodes of the context tree are used to cluster the sequences of the first set of data. In the k-means algorithm a distance measure is used to form clusters. In this specific case, the distance measure is a difference between estimated conditional probabilities of leaf nodes of the context tree. Thus, all sequences of the first set of data that extend between a root node and a specific leaf node of the context tree and of which the estimated conditional probabilities of the sequences have a similar value, are assigned to one cluster. Efficient implementations of the k-means algorithm are available and because of the use of a one dimensional distance measure, the actual clustering can be performed efficiently.

Optionally, in the stage of assigning sequences of the first set of data to clusters, sequences of the first set of data ending in leaf nodes having a total count that is lower than a minimum number of observations are assigned to two additional clusters. Sequences ending in leaf nodes having the estimated conditional probability that is smaller than 0.5 and having the total count that is smaller than the minimum number of observations are assigned to a first one of the two additional clusters. Sequences ending in leaf nodes having the estimated conditional probability that is larger than 0.5 and having the total count that is smaller than the minimum number of observations are assigned to a second one of the two additional clusters. Sequences ending in leaf nodes having an estimated conditional probability that is equal to 0.5 and having the total count that is smaller than the minimum number of observations are assigned to either the first one of the additional clusters or the second one of the additional clusters.

If a relatively small number of sequences of the first set of data extend from the root node of the context tree to a specific leaf node, than the sum of the count values of this specific leaf node is relatively low. The estimated conditional probability is based on the count values of the node, and a low count values result in a relatively unreliable estimated conditional probability. Therefore it is more appropriate to cluster the sequences that end in leaf nodes with a relatively small total count in two separate groups: those with an estimated conditional probability smaller than 0.5 and those with an estimated conditional probability higher than 0.5. Thereby the other clusters are not polluted with sequences that have a relatively unreliable estimated conditional probability and thereby two additional clusters are obtained that represent sequences that have at least the following characteristics in common: a high or low estimated conditional probability and there are not many sequences in the first set of data that are equal to the unique sequences that end up in these two additional clusters. This embodiment is in particular useful if the sequences of the first set of data are relatively long compared to the total number of sequences present in the first set of data because, in that situation, there will be a number of sequences in the first set of data that are not equal to other sequences in the first set of data or are only equal to a limited number of other sequences in the first set of data.

A more general description of the above embodiment is: in the stage of assigning sequences of the first set of data to clusters, sequences of the first set of data ending in leaf nodes having a total count that is lower than the minimum number of observations are assigned to two or more additional clusters. Subsequently each additional cluster is associated with a sub-interval of the probability interval from 0 to 1. The two or more sub-intervals all have an equal width, are consecutive intervals within the probability interval from 0 to 1 and the combination of all sub-intervals is the probability interval from 0 to 1. Subsequently, the sequences having a total count that is a lower than the minimum number of observations are assigned to the one or more clusters on basis of the estimated conditional probability of the leaf node in which the sequences and in which sub-interval the estimated conditional probability falls.

Optionally, the clusters of the sequences of the first set of data are further optimized by an iterative optimization method to minimize an optimization function comprising a conditional entropy of the second set of data given the data of the clusters. In this optional embodiment, the result of the above described assigning of the sequences of the first set of data to cluster is considered to be a relatively good starting point that can be optimized further. A goal is to maintain as most as possible mutual information between the second set of data and the clustered data and thus the conditional entropy of the second set of data given the data of the clusters must be minimized. By further optimizing the cluster according to this optimization criterion, more mutual information is maintained and thus a better result is obtained. It is to be noted that one may also select another optimization criterion that is based on maximizing the mutual information between the data of second set of data and the data of the clusters.

Optionally, the iterative optimization method comprises simulated annealing. The problem of assigning sequences to clusters such that the conditional entropy of the second set of data given the data of the clusters is minimized is a multidimensional problem and the solution space of this problem has most probably many points that are a local optimum. In particular simulated annealing is able to explore many different areas of the solution space to find a relatively good optimum and possibly the global optimum.

Optionally, the sequences of instances of the first type of data of the first set of data comprise time series of sensor data. Each time series comprises results of measurements of one specific sensor at consecutive moments in time and the specific sensors are of an equal type. The result will be that clusters represent sequences of the first set of data that have similar time evolutionary characteristics.

Optionally, the instances of the second set of data are binary data instances. In other words, the instances of the second set of data can only obtain a first value or a second value such as, for example, 0 and 1.

Optionally, in the above described assigning based on conditional probabilities is based on the conditional probabilities that the data of the second set of data is equal to one given an unique sequence of the first set of data.

According to a further aspect of the invention, a method of compacting a data set comprising sequences of instances of the first type of data are provided. The instances of the first type of data being based on sensor data. The method comprising i) obtaining the data set, ii) one of the above discussed methods of determining clusters, wherein the obtained data set is the first set of data in the one of the methods of determining clusters, iii) replacing, in the data set, the sequences of instances of the first type of data by an identification data of the cluster to which the sequence is assigned, the identification data of a specific cluster uniquely identifies the specific cluster and can be stored by a fewer number of bits than an individual sequence of the data set. The method of the further aspect has similar embodiments, effects and advantages as the previously discussed methods of determining clusters.

According to a further aspect of the invention, a method of transmitting compacted data comprising at least one sequence of instances of the first type of data is provided. The at least one sequence is a sequence to be transmitted. The method comprising: i) obtaining the at least one sequence, ii) one of the above discussed methods of determining clusters, iii) selecting one of the clusters that are provided by the method of determining clusters as the cluster that best matches with the at least one sequence, iv) transmitting an identification data of the selected cluster instead of the at least one sequence, the identification data of a specific cluster uniquely identifies the specific cluster and can be stored by a fewer number of bits than the sequence. The method of the further aspect has similar embodiments, effects and advantages as the previously discussed methods of determining clusters.

According to a further aspect of the invention, a computer program for determining clusters of sequences of instances of data of a first type of data for compacting data set comprising sequences of instances of the first type of data is provided. The program is operative to cause a processor to perform one of the above discussed methods of determining clusters.

BRIEF DESCRIPTION OF THE DRAWINGS

These and other aspects of the invention will be apparent from and elucidated further with reference to the embodiments described by way of example in the following description and with reference to the accompanying drawings, in which FIG. 1 schematically shows an embodiment of a device for determining clusters of sequences of instances of data of a first type of data, FIG. 2 schematically shows an embodiment of a method of determining clusters of sequences of instances of data of a first type of data, FIG. 3 schematically shows machines of the same type that may provide data that is the basis for the first set of data and the second set of data, FIG. 4 schematically shows an embodiment of a computer program product, and FIG. 5 schematically shows a Context Tree Weighing (CTW) tree for an example first and second data set.

The figures are purely diagrammatic and not drawn to scale. In the Figures, elements which correspond to elements already described may have the same reference numerals.

DETAILED DESCRIPTION OF EMBODIMENTS

Figure 3:
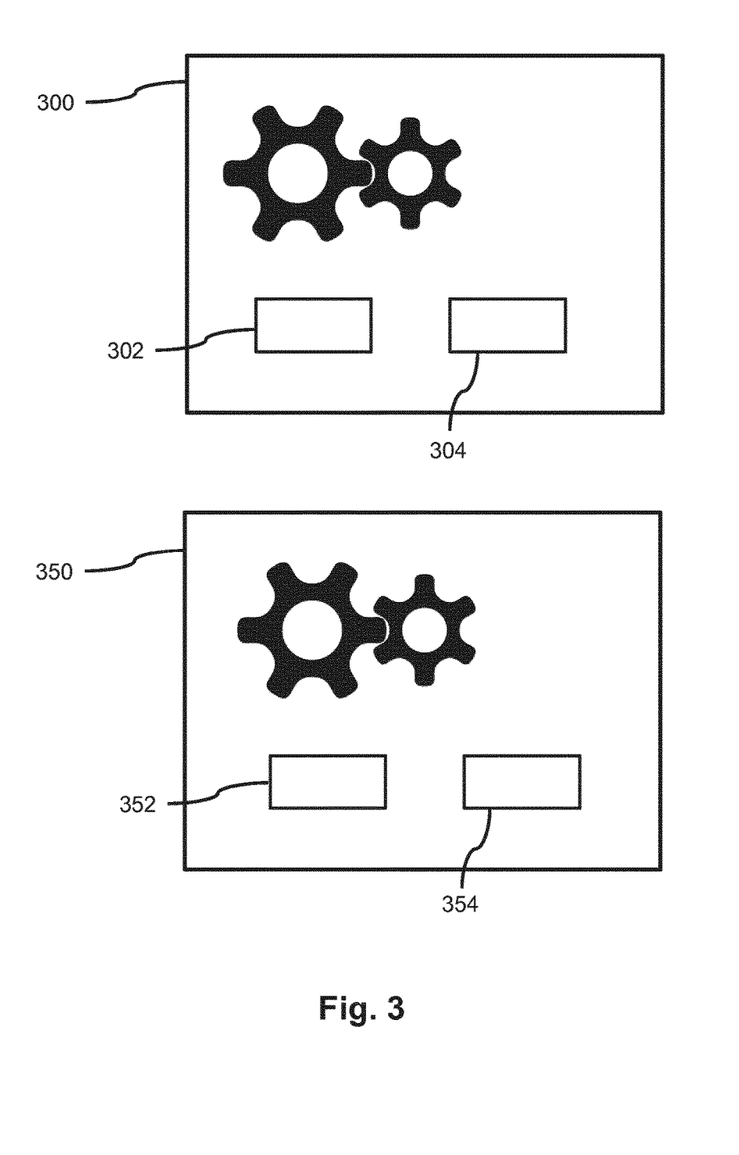

FIG. 3 schematically shows two machines 300, 350 of the same type that may generate instances of a first type of data and instances of a second type of data. FIG. 3 is an example of an area where the device and method for determining clusters of data can be applied. Both machines may provide quite a lot of data, e.g. in their log-files, and it may be necessary to compact that data. This figure is being used in the discussion of FIG. 1. It is to be noted that both machines 300, 350 are of the same type, which means that they are of the same design, perform the same function, etc. Both machines 300, 350 comprise sensors 302, 352 that generate instances of a first type of data. This means that sensors 302, 352 are similar to each other and have the same function in both machines 300, 350. For example, the sensors 302, 352 measure a temperature of a motor of the machine. Both machines 300, 350 have a physical entity 304, 354 of which a characteristic is determined and/or has to be predicted. The characteristic is an instance of a second type of data. For example, the physical entity 304, 354 are a motor of the machine and the characteristic is "the motor 304 or 354 is operating or malfunctions". In this context, there may be a relation between data that is obtained from the sensors 302, 352 and the characteristics of the physical entity (e.g. the motor 304, 354, respectively). If the temperature of the motor 304, 354 is rising or is arriving at a relatively high level, the probability that the respective motor will be defect within a certain period of time raises. Therefore, the instances of the first type of data can be used to predict the characteristic of the physical entity.

The instances of the first type of data may also be obtained from the sensor at consecutive moments in time such that a sequence of data is obtained that contains time evolutionary aspects. In particular the time evolutionary aspects of the instances of the first type of data may be interesting to predict instances of the second type of data. For example, when a temperature of a motor is continuously raising in a particular interval of time, this may be a sign that the motor is going to overheat and may become defect within an interval of time. In the following of this document there is a focus on sequences of instances of the first type of data. It may be that these sequences represent a time series of instances of the first type of data, which means that the instances are obtained/determined at consecutive moments in time. It must be noted that the embodiments are not necessarily limited to such time series of instances of the first type of data.

It is to be noted that the instances of data of the first type are not necessarily obtained from the sensors 302, 352. The instances of the first type of data may also be data that represents characteristics of a physical entity that are not sensed by a sensor but may be known as a state of the physical entity. For example, a controller may control the motors 304, 354 on and off and the controlled on and off state may also be the instances of the data of the first type.

Also if one want to predict when the motors 304, 354 are going to break down, the controlled on and off state may be useful data that can be used in the prediction of a possible break down of the motors 304, 354.

The embodiments of this invention are discussed also with references to FIG. 3. However, embodiments are not limited to sensors of machines and to embodiments in which the characteristic of a physical entity is the temperature of a motor of a machine. The sensors are not necessarily included in the machines, and they may measure, for example, environmental data. A different application of the embodiments may be in the field of predicting energy use of a lighting system building. The characteristics of the physical entity may be the energy use of lamps in different offices of a particular size in an office building and the instances of the first type of data may, for example, be the output of occupancy sensors provided in the different offices of the particular size.

Figure 1:
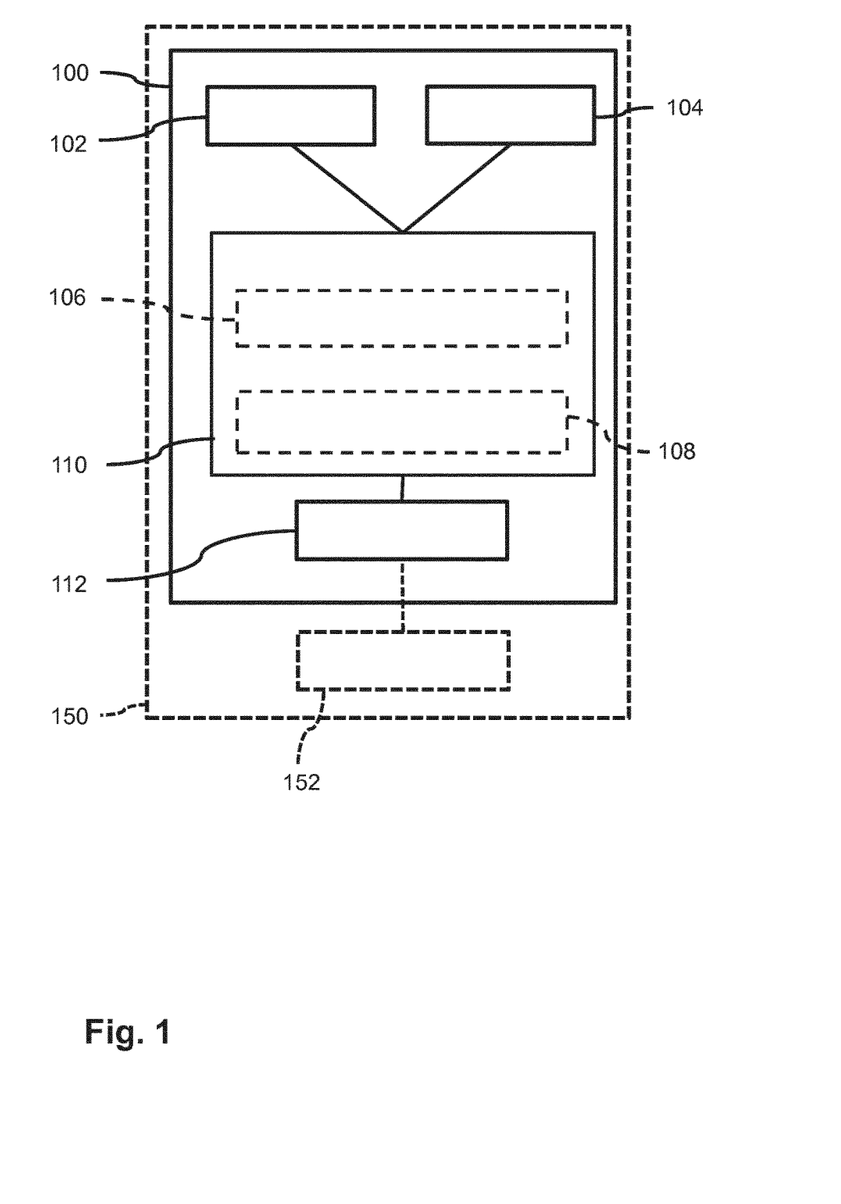

FIG. 1 schematically shows an embodiment of a device 100 for determining clusters of sequences of instances of data of a first type of data. The clusters may be used for compacting a data set comprising sequences of instances of the first type of data. The sequences of the data set may be the sequences that are clustered, but may also be other sequences that are similar to the sequences that are clustered, and based on similarities between the clustered sequences and then the other sequences may be compacted as well. The clustering can be used for compaction because instead of storing/transmitting the complete sequences of instances of the first type of data, an instance of data may be stored/transmitted that uniquely identifies the cluster to which the respective sequence of instances of the first type of data belongs.

The device 100 comprises a first data set unit 102 for obtaining a first set of data that comprises sequences of instances of the first type of data. Optionally, instances of the first type of data comprising data are based on sensor data, for example, based on the measurements of the sensors 302, 352 of FIG. 3. In the detailed description of the embodiments the first set of data is indicated by X and the sequences are indicated by $x_i$. The number of sequences $x_i$ of instances of the first type of data in the first set of data X is indicated with n. The j'th instance in the sequences $x_i$ of instances of the first type of data is indicated with $x_{ij}$. The sequences $x_i$ have a length that is equal to m. In an embodiment, each sequence $x_i$ may represent a time series, which means that the instances $x_{ij}$ of a particular instance $x_i$ are obtained/determined from a specific sensor at consecutive moments of time during a particular interval of time. If the sequences $x_i$ are time series, it is assumed in the context of this document that $x_{i1}$ is the oldest instance of the first type of data and that $x_{im}$ is the most recent instance of the first type of data. In embodiments, the data present in the first set of data is discrete data that is obtained by quantizing continuous data provided by the sensors.

In an embodiment, the first set of data is represented by a matrix X:

$$X = \begin{bmatrix} x_1 \\ \vdots \\ x_n \end{bmatrix} = \begin{bmatrix} x_{11} & \cdots & x_{1m} \\ \vdots & \ddots & \vdots \\ x_{n1} & \cdots & x_{nm} \end{bmatrix}$$

It is to be noted that the rows in the matrix X are the sequences $x_i$.

In an example that is discussed further in this application, the first data set may have the subsequent data:

$$X_{example} = \begin{bmatrix} 1 & 1 & 0 \\ 1 & 0 & 0 \\ 0 & 0 & 1 \\ 0 & 1 & 0 \\ 1 & 0 & 0 \\ 0 & 0 & 1 \\ 0 & 1 & 1 \end{bmatrix}$$

Please note that in this example, the instances of data of the first type have a binary value, that the sequences have a length of m=3 and that there are n=7 sequences.

Embodiments are not limited to the use of the above matrix X. The use of a matrix with the sequences as rows is just an implementation detail and a skilled person knows that matrices can be transposed or that an ordering between the columns or between the rows may be changed as well. In embodiments one may also work with matrices to which a scaling factor has been applied.

The device 100 also comprises a second data set unit 104 for obtaining a second set of data comprising instances of the second type of data. Optionally, instances of the second type of data comprising data may be based on a characteristic of a physical entity. The characteristic is, for example, in the context of FIG. 3, whether the motor 304, 354 is operating correctly or not. Each instance of the second set of data corresponds to a sequence in the first set of data. The second set of data is indicated with Y. The instances of the second set of data Y are indicated with $y_i$:

$$Y = \begin{bmatrix} y_1 \\ \vdots \\ y_n \end{bmatrix}$$

Every instance $y_i$ corresponds to, belongs to, a sequence $x$ of the first set of data X. Thus, there are n instances $y_i$ in the second set of data Y. Corresponding to or belonging to means in this context means that the data of the sequence $x_i$ is in the physical world related to the characteristics $y_i$ of the physical entity, thus, the instances of the sequence $x_i$ comprise information that have resulted in the instance $y_i$. In the context of FIG. 3 this means that the instances $y_i$ of the physical characteristic belong to a sequence of sensor data $x_i$ that is obtained from the same machine as from which the physical characteristic has been obtained and that the sequence of sensor data precedes the moment in time that the instance $y_i$ is obtained/determined. Optionally, the instances of the second set of data may be binary data instances.

In an example that is discussed further in this application, the first data set may have the subsequent data:

$$Y_{example} = \begin{bmatrix} 0 \\ 1 \\ 0 \\ 0 \\ 0 \\ 1 \\ 1 \\ 0 \end{bmatrix}$$

The device 100 also comprises a sequence clustering unit 110 that is configured to assign the sequences $x_i$ of the first set of data X to cluster. The whole set of clusters is indicated with C and one specific cluster is indicated with $c_p$. The assigning of a specific sequence $x_i$ to a specific cluster $c_p$ is based on a conditional probability that belongs to the specific sequence. Each sequence $x_i$ has a conditional probability that an instance of the second set of data is equal to a specific value (for example, 0, or 1) given the sequence, for example $P(y=0|x_i)$. Sequences $x_i$ having a value for the conditional probability $P(y=0|x_i)$ close to each other may end up in the same cluster. If the first set of data X and the second set of data Y are known, the conditional probabilities can be calculated by the well-known ways of calculating such conditional probabilities as known from probability theory. The most basic methods to calculate the conditional probabilities are based on counting the number of occurrences of certain instances of the first set of data X and counting the number of occurrences of certain instances of the second set of data Y. The number of clusters is indicated with k and may be chosen by a user. The number k may, for example, be chosen on basis of the variability of the conditional probabilities or may be based on the total number n of sequences $x_i$ in the first set of data X. For example, the number of cluster is set to $\sqrt{n}$. Choosing $\sqrt{n}$ clusters results in maintaining quite a lot of mutual information between the first set of data and the second set of data. The clustering unit 110 is coupled to the first data set unit 102 and the second data set unit 104 for receiving the first set of data X and the second set of data Y.

In the above discussed example of $X_{example}$ and $Y_{example}$, the conditional probabilities $P(y=0|x_i)$ have to be determined. This can be calculated by:

$$P(y=0|x_i) = \frac{P(y=0 \cap x_i)}{P(x_i)} = 1 - P(y=1|x_i) = 1 - \frac{P(y=1 \cap x_i)}{P(x_i)}$$

As an example, based on counting certain combinations in the data sets $X_{example}$ and $Y_{example}$:

$$P(y=0|x_1) = P(y=0|110) = \frac{P(y=0 \cap 110)}{P(110)} = \frac{\frac{1}{7}}{\frac{1}{7}} = 1$$

The other conditional probabilities can be calculated in the same way and their values are:
$P(y=0|x_2)=0$
$p(y=0|x_3)=\frac{1}{2}$
$P(y=0|x_4)=1$
$P(y=0|x_5)=P(y=0|x_2)=0$
$P(y=0|x_6)=P(y=0|x_3)=\frac{1}{2}$
$P(y=0|x_7)=1$ Because there are 7 sequences in the first data set X, it seems logical to build three clusters ($\sqrt{}=2.6$). Based on conditional probabilities that are close to each other or equal to each other, one may conclude that the subsequent three clusters must be formed, namely:
$C_1=\{x_1, x_4, x_7\}$
$C_2=\{x_2, x_5\}$
$C_3=\{x_3, x_6\}$ In the above clustering quite a lot of mutual information between the first set of data X and the second set of data Y is maintained. It follows from information theory that, if most of the mutual information between the instances of the first type of data and the instances of the second type of must be maintained during the clustering, the conditional entropy of instances of the second type of data given the cluster $H(Y|C)$ must be kept as low as possible, e.g. may be minimized. The inventors have derived the following:

$$H(Y|C) = \sum_{c=1}^{k} p(c)H(Y|C=c)$$

$$= \sum_{c=1}^{k} \left[\sum_{x \in c} p(x)\right] H(Y|x \in c)$$

$$= -\sum_{c=1}^{k} \left[\sum_{x \in c} p(x)\right] \sum_{y} p(y|x \in c)\log_2 p(y|x \in c)$$

Based on this derivation the inventors have concluded that if the conditional entropy of instances of the second type of data given the clusters $H(Y|C)$ must be minimized, one has to create clusters/groups such that each cluster/group has a low values for $-\Sigma_y p(y|x \in c)\log_2 p(y|x \in c)$ and have similar values for $\Sigma_{x \in c} p(x)$. If it is assumed that the values of the instances of the second set of data Y are binary values, a low value of $-\Sigma_y p(y|x \in c)\log_2 p(y|x \in c)$ is obtained for a specific group if there is a large difference between $P(y=0|x \in c)$ and $P(y=1|x \in c)$ for the specific group. The inventors came to the inside that one has to group sequences $x_i$ into one cluster $c_p$ if the sequences $x_i$ have a similar value for $P(y=0|x_i)$ because if the values of $P(y=0|x_i)$ for one specific cluster $c_p$ would vary quite a lot, the value for $p(y=0|x \in c_k)$ would converge to 0.5 as the expected mean of randomly drawn numbers from the interval [0,1] and then the value of $P(y=1|x \in c_p)$ will also converge to 0.5. Thus, by basing the clustering on $P(y=0|x_i)$, or on basis of $P(y=1|x_i)$, for the sequences $x_i$, one obtains a clustering that results in a relatively low value for the conditional entropy of the second set of data given the data of the cluster $H(Y|C)$ and, thus, a relatively large amount of mutual information between the first set of data and the second set of data $I(X, Y)$ is maintained in the clustered data.

The device 100 also comprises an output unit 112 that provides the clusters C to, for example, a data reduction arrangement 150 for compacting the sequences $x_i$ of instances of the first type of data of, for example, the first set of data X. The output unit 112 is coupled to the sequence clustering unit 110 for receiving the clusters C. It is to be noted that the provided clusters C may also comprise additional information that may help to map the sequences $x_i$ to the clusters $c_p$. For example, a map may be provided that maps each sequence $x_i$ to a specific cluster $c_p$. Alternatively, for each cluster $c_p$ a representative instance $x_p$ from the first set of data is provided such that each instance $x_i$ of the first set of data X belongs to the specific cluster that has a representative instance $x_p$ that is closest to the respective instance $x_i$. It is to be noted that the device 100 may also provide additional information together with the clusters, for example, the probability that a sequence $x_i$ ends up in a cluster may be provided, thus, $P(c_p)$. The device 100 may also provide additional information that is useful in the context of using the clusters to predict instances $y_i$ of the second type of data, such as, for example $P(y|c_p)$.

Thus, optionally, the device 100 is part of a data reduction arrangement 150. This data reduction arrangement 150 may comprise a compaction unit 152. The compaction unit 152 may be coupled to the output unit 112 and receives from the output unit 112 the clusters C and data that relates the instances $x_i$ to the clusters C. Subsequently, the compaction unit 152 may generate identification data $id_k$ that can be used to uniquely identify the different clusters $c_p$. The identification data $id_k$ for each cluster $c_p$ is shorter than the length of the sequences $x_i$ of the first set of data X such that less data is required to be stored (and if the first set of data X must be transmitted, less bandwidth is required to transmit the first set). Thereafter the compaction unit 152 replaces each sequence $x_i$ with the identification data of the cluster to which the respective sequence is assigned. Thereby the amount of data present in the first set of data X reduces and, thus, the first set of data X is compacted.

If the device 100 for determining clusters is embedded in a device that has to transmit sequences of instances of the first type of data, the output of the output unit 112 can be used to replace the sequence $x_i$ to be transmitted with identification data $id_k$ such that less data has to be transmitted. It may be, that before sequences are transmitted, information about the clusters C and possible characteristics of sequences of the clusters is transmitted to the receiver such that the receiver is able to interpret the received identification data $id_k$.

Figure 2:
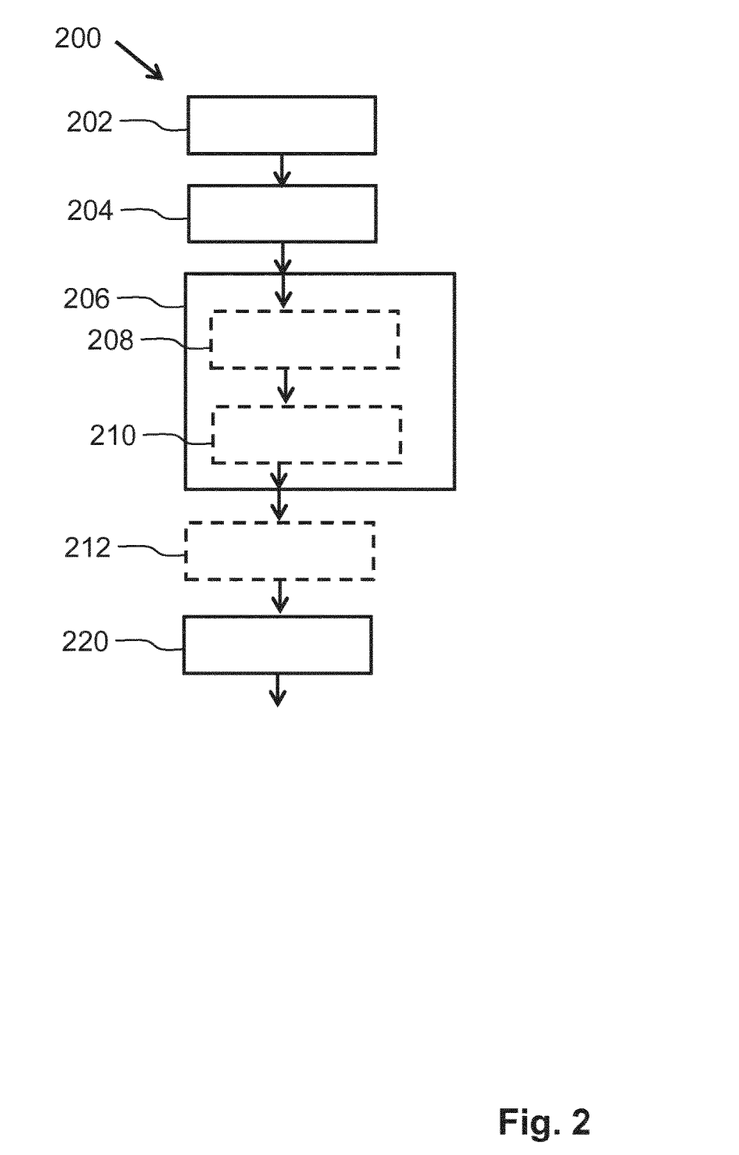

FIG. 2 schematically shows an embodiment of a method 200 of determining clusters C of sequences $x_i$ of instances $x_{ij}$ of data of a first type of data. The clusters C are determined for compacting a data set comprising sequences of instances of the first type of data. The instances $x_i$ of the first type of data comprise information for predicting instances $y_i$ of a second type of data. Optionally, the instances $x_i$ of the first type of data comprising data being based on sensor data. Optionally, the instances $y_i$ of the second type of data comprising data being based on a characteristic of a physical entity. The method 200 comprising: i) obtaining 202 a first set of data X comprising sequences $x_i$ of instances $x_{ij}$ of the first type of data; ii) obtaining 204 a second set of data Y comprising instances $y_i$ of the second type of data, each instance $y_i$ of the second set of data Y corresponds to, e.g. belongs to, a sequence $x_i$ in the first set of data X; iii) assigning 206 the sequences $x_i$ of the first set of data X to clusters C, the assigning is based on conditional probabilities, each sequence $x_i$ of the first set of data X has a conditional probability $P(y|x_i)$ for an instance of the second set of data is equal to a specific value given the sequence $x_i$; iv) providing 220 the clusters C to, for example, a data reduction arrangement for compacting the sequences of instances of the first type of data.

The above discussed method 200 has similar embodiments, effects and advantages as the device 100 that has been discussed in the context of FIG. 1. Hereinafter more embodiments of the method 200 are discussed. It is to be noted that the device 100 may also have similar embodiments, effects and advantages as the hereinafter discussed embodiments of the method 200.

In an embodiment, the assigning of the sequences $x_i$ of the first set of data X to cluster C comprises applying 208 the Context Tree Weighting method to the first set of data X and the second set of data Y to obtain a context tree. In the Context Tree Weighting method every unique sequence $x_i$ of the first set of data is represented by a path in the context tree from a root node to a specific leaf node and counts stored in nodes of the context tree are based on the corresponding instances $y_i$ of the second set of data.

The Context Tree Weighting method is well known in the art of information theory and (text-) compression and has, for example, been described by Willems et al in papers i)

"The Context-Tree Weighting Method: Basic Properties", Willems et al, IEEE Transactions on Information Theory, Vol 42, No 3, pp 653-664; ii) "Reflections on 'The Context-Tree Weighting Method: Basic Properties'" Willems et al., *Newsletter of the IEEE Information Theory Society*, 1997; and iii) "1996 IT society Paper Award, Reflection on the Prize Paper: 'The Context-Tree Weighting Method: Basic Properties'", Willems et al, IEEE Information Theory Society Newsletter, Vol. 47, No 1, March 1997, pp 19-27. The above mentioned papers i), ii) and iii) are hereby included by reference.

For example, if three sequences $x_1$, $x_2$ and $x_5$ of the first set of data X are equal to each other, then they are all three represented by a path in the context tree that starts with an edge from the root node of the context tree to a subsequent node in the context tree and this edge is marked with the value of instance $x_{1m}$ of the sequence $x_1$. The last edge of the path is from a node at depth m−1 to a specific leaf node at depth m. This last edge is marked with the value of instance $x_{11}$ of the sequence $x_1$. In particular if the sequences $x_i$ are time series, the most recent instance of the first type of data of each unique sequence $x_i$ marks the first edge from the root node, and the oldest instance of the first type of data of each unique sequence $x_i$ marks the last edge of the path that ends in the leaf node. It is also to be noted that if the instances of the first type are stored in a different order in the sequences $x_i$, the marking of the edges of the paths in the context tree may be performed differently in according to the different order. In the specific leaf node counts are stored that count the values of the corresponding instances $y_1$, $y_2$ and $y_5$. If the instances of the second set of data Y are binary values, the counts of the nodes are for example indicated with a for the number of corresponding instances that have the value 0 and b for the number of corresponding instances that have the value 1. For example, if $y_1=1$, $y_2=0$ and $y_5=0$, then a=2 and b=1. This forming of the context tree with the Context Tree Weighting (CTW) Method has been discussed, for example, on page 24, 25 and 26 of the paper of the above discussed paper "1996 IT society Paper Award, Reflection on the Prize Paper: 'The Context-Tree Weighting Method: Basic Properties'". The discussion of the CTW method starts at the paragraph "CTW algorithm" and ends with the paragraph "complexity". For sake of completeness, the paragraphs "tree sources" and "context tree" of the paper are also considered to be part of the description of the discussion of the CTW method.

Initially the Context-Tree Weighting Method has been described for binary data and how this may be may be used to compact text-data. Today the practitioner in the art has several implementations at his disposal for other forms of non-binary data. Thus, if the discrete data in X or Y has more than two different possible values, one of such implementations must be used to build the first context tree. For example, the article "Context Tree Weighting: Multi-alphabet Sources" of Tjalkens et al, Proceedings Fourteenth Symposium on Information Theory in the Benelux, Veldhoven, The Netherlands, May 17-18, 1993, pp. 128-135 describes how the Context-Tree Weighing method may be applied to non-binary data. The document "Context Tree Weighting: Multi-alphabet Sources" is herewith included by reference.

Optionally, in the method 200, the assigning 206 of the sequences $x_i$ of the first set of data X to cluster C comprise clustering 210 the sequences $x_i$ of the first set of data X according to an estimated conditional probability that is based on the counts of a specific leaf node of the context tree in which the respective sequence $x_i$ ends. In the Context Tree Weighting method, for each leaf node counts are registered and one can use these counts to calculate the so-termed Krichevsky and Trofimov estimator (KT estimator). If the counts relate to binary data, then the estimated conditional probability $P_{ec}$ is defined by: $P_{ec}(a, b) = KT_{estimator}$ $$(a, b) = \frac{a + \frac{1}{2}}{a + b + 1},$$

wherein a is the number of counted 0's and b is the number of counted 1's. The KT-estimator for binary data is also discussed in the above provided references of the CTW algorithm.

The value of the estimated conditional probability $P_{ec}$ of a specific leaf node is an estimate for the conditional probability $P(y|x_i)$ of the data of the second set of data given the specific unique sequence $x_i$ of which the path ends in that specific leaf node. More specifically, if the instances of the second set of data are binary data instances, the above given estimated conditional probability $P_{ec}$ of a specific leaf node is an estimate for the conditional probability $P(y=1|x_i)$, wherein $x_i$ is the unique sequence x of which the path in the context tree ends in the specific leaf node. Thus, the estimated conditional probabilities $P_{ec}$ of the leaf nodes of the context tree can be used to clusters the sequences $x_i$ of the first set of data X. Thus, one may conclude that clusters of leaf nodes are formed and that all sequences $x_i$ of the first set of data X that correspond to the unique sequence that ends in a specific leaf nodes are assigned to the cluster to which the specific leaf node is assigned.

Figure 5:
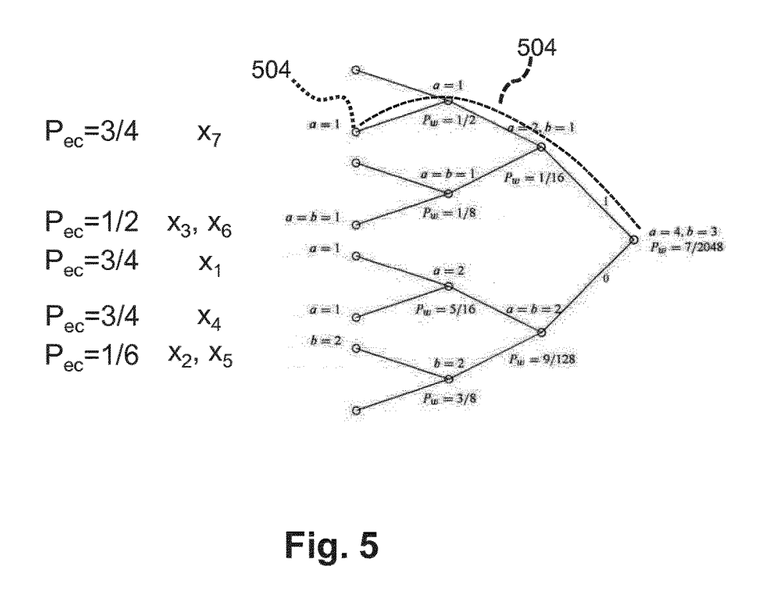

The above discussed datasets $X_{example}$ and $Y_{example}$ are also the data set that are used in the above cited papers to explain how a Context Tree Weighing (CTW) tree has to be build and how the estimated probabilities of the nodes of the tree must be calculated. The CTW tree that is being build based on the Context Tree Weighing Method is presented in FIG. 5. The drawn CTW tree is obtained from "Reflections on 'The Context-Tree Weighting Method: Basic Properties'" Willems et al., *Newsletter of the IEEE Information Theory Society*, 1997. In FIG. 5 it has further indicated at the leaf nodes of the tree which sequences of the example first data set $X_{example}$ end up in that specific leaf node. For example, the sequence $x_7$ ends up in leaf node 504. The indicated path 504 through the CTW tree is determined by sequence $x_7$. Instance $x_{73}=1$ determines that the path moves in an upward direction from the root node to the node at depth 1, instance $x_{72}=1$ determines that the path moves in an upward direction from the node at depth 1 to the node at depth 2, and instance $x_{73}=0$ determines that the path moves in a downwards direction from the node at depth 2 up to the leaf node 504. The value of $y_7=0$ determines that the counts of (a,b) are (1,0) in leaf node 504. By using the count values (a,b) of the leaf nodes where a sequence $x_i$ ends, one may calculate the above discussed estimated conditional probability $P_{ec}$.

The estimated conditional probabilities are then for the subsequent sequences $x_i$:

$x_1$: a=1, b=0: $P_{ec}=3/4$
$x_2$, $x_5$: a=0, b=2: $P_{ec}=1/6$
$x_3$, $x_6$: a=1, b=1: $P_{ec}=1/2$
$x_4$: a=1, b=0: $P_{ec}=3/4$
$x_7$: a=1, b=0: $P_{ec}=3/4$

It can be seen that the estimated conditional probabilities $P_{ec}$ are not exactly the same as the above provided conditional estimated probabilities, however, one can also see that there is a correlation between the estimated probabilities $P_{ec}$ and the conditional probabilities.

Optionally, in the method 200, the assigning of the sequences $x_i$ of the first set of data X to clusters C uses a k-means algorithm to form the clusters C. If the assigning uses the Context Tree Weighting method according to the above discussed embodiments, the k-means algorithm uses the estimated conditional probabilities $P_{ec}$ of the leaf nodes of the context tree to cluster the sequences $x_i$ of the first set of data X. Please note that the k-means algorithm may also use the earlier discussed conditional probabilities in the same way as it is discussed here for the estimated conditional probabilities $P_{ec}$. In the k-means algorithm one has to select a number of clusters to be formed. In an embodiment, the number is set to 5, 6 or 7. As the result of the k-means algorithm, sequences that have an estimated conditional probability $P_{ec}$ value close a specific mean value associated with a specific cluster are put in the specific cluster. One may also select a number of clusters that is equal to $\sqrt{n}$ because it is known that at such number of clusters most of the mutual information between the first set of data X and the second set of data Y is maintained in the clusters. The k-means algorithm is, for example, described in the textbook "An introduction to Statistical learning" of G. James et al and published by Springer, 2013, New York. This book can also be obtained via the weblink: http://www-bcf.usc.edu/~gareth/ISL/ISLR %20First %20Printing.pdf.

If, for the in FIG. 5 presented CTW tree, clusters must be formed based on the estimated conditional probabilities $P_{ec}$, it is suggested to form 3 clusters (because $\sqrt{7}$=2.6) and sequences that end up in leaf nodes that have an estimated conditional probability that are close to each other are appointed to the same cluster. Thereby the subsequent clusters are obtained:
$C_1=\{x_1, x_4, x_7\}$
$C_2=\{x_2, x_5\}$
$C_3=\{x_3, x_6\}$ As we can see we end up at exactly the same clustering as the clustering that was obtained directly from the conditional probabilities. Therefore it is concluded that using the estimated conditional probabilities of the leaf nodes is a good estimate for obtaining the same clustering compared to the situation in which the conditional probabilities are directly used.

It has to be noted that also other suitable clustering algorithms may be used and that embodiments are not limited to the use of the k-means clustering algorithm. It may be that the length of the sequences $x_i$ of the first set of data X is relatively long compared to the number n of sequences $x_i$ in this first set of data X. In that case it may be that in some leaf nodes the counts are relatively low, for example, smaller than a defined minimum number of observations minObs which makes the estimated conditional probability of these leaf nodes relatively inaccurate.

In an embodiment, all leaf nodes of which the total count is smaller than the minimum number of observations minObs are excluded from clustering on basis of the estimated conditional probability $P_{ec}$, but are assigned to two additional clusters. All sequences $x_i$ that end in a specific leaf node with a total count smaller than the minimum number of observations minObs and that specific leaf node has an estimated conditional probability $P_{ec}$ smaller than 0.5 are assigned to a first one of the two additional clusters. All sequences $x_i$ that end in a specific leaf node with a total count smaller than the minimum number of observations minObs and that specific leaf node has an estimated conditional probability $P_{ec}$ larger than 0.5 are assigned to a second one of the two additional clusters. All sequences $x_i$ that end in a specific leaf node with a total count smaller than the minimum number of observations minObs and that specific leaf node has an estimated conditional probability $P_{ec}$ equal to 0.5 are assigned either to the second one of the two additional clusters or to the first one of the two additional clusters.

Above the method stages of applying 208 the Context Tree Weighting method and clustering 206 the sequences $x_i$ of the first set of data X are discussed. It is to be noted that the device 100 of FIG. 1 may comprise a Context Tree Weighting method application unit 106 and a clustering unit 108 that are configured to perform the same function/task as the discussed method stages of applying 208 the Context Tree Weighting method and clustering 206 the sequences $x_i$ of the first set of data X. The units 106 and 108 may have similar embodiments as the embodiments of the method stages with similar effects and advantages.

Optionally, after assigning the sequences $x_i$ of the first set of data X to clusters C, the method may comprise an additional optimization stage 212 wherein the cluster C for the sequences $x_i$ of the first set of data X are further optimized by an iterative optimization method to minimize an optimization function that is derived from, may be based on, or may be equal to a conditional entropy H(Y|C) of the second set of data Y given the data of the clusters C. The calculation of this conditional entropy is as follows:

$$H(Y \mid C) = \sum_y \sum_c P(y, c) \log \frac{P(c)}{P(y, c)},$$

wherein P(c) is the probability that an instance of the first set of data X ends up in the specific cluster c. and P(y,c) is the probability that an instance of the second set of data Y has the value y and is in the specific cluster c. For example: P(cluster1) can be calculated by dividing the number of sequences of the first set of data that are assigned to cluster1 by the total number of instances n in the first set of data X; For example, if instances of the second set of data have a binary value: for calculating P(y=0, c=cluster_1) one has to count for all sequences $x_i$ of the first set of data X that end up in cluster_1, how often their corresponding instance $y_i$ of the second set of data Y is equal to 0, the count is indicated by c. Then P(y=0, c=cluster_1)=c/n wherein n is the total number of instances in the first set of data X and in the second set of data Y.

In an example, in the additional optimization stage 212 wherein the cluster C of the sequences $x_i$ of the first set of data X are further optimized, in each iteration one or more specific sequences $x_i$ of the first set of data X are moved to another cluster and it is checked whether the conditional entropy H(Y|C) of the second set of data Y given the data of the clusters C becomes smaller and if so, a better solution has been found. In an embodiment, the used iterative optimization method comprises the simulated annealing optimization method. One may, for example, use the approach discussed in the article: "Convergence Theorems for a Class of Simulated Annealing Algorithms on $R^{d}$" of Claude J. P. Bélisle, Journal of Applied Probability, Vol. 29, No. 4 (December, 1992), pp. 885-895. The article of C. J. P. Bélisle is herewith incorporated by reference. In simulated annealing an imaginary temperature function and a probability function are important and this article provides useful proposals for such functions.

In the above context, it has been described that the first set of data X comprises sequences $x_i$ of instances of the first type of data. The term sequence is used to indicate that the instances of one sequence originate from one specific source, for example, one specific sensor. Each sequence has its own source and all sources are of the same type and have the same function. For example, each sequence originates from one type of sensors that has in machines of the same type the same function. For example, in the context of FIG. 3, the sources are the temperature sensors 302, 352 that measure the temperature of the motors of respective machines 300, 350. In one embodiment, the sequences are time series of measurements of one specific type of sensors. The meaning of time series is that the instances of the first type of data are obtained/derived/measured within an interval of time at consecutive moments in time.

Optionally, one of the above discussed methods of determining clusters may be part of a method of compacting a data set that comprises sequences of instances of the first type of data and that the data is based on, for example, derived from, sensor data. The method comprises obtaining the data set with the sequences of instances of the first type of data. The obtained data step fulfills the function of the first set of data X in the included method of determining clusters. The output of the included method of determining clusters is subsequently used to replace sequences of instances of the first type of data of the data set by identification data of the clusters to which the respective sequences are assigned in the included method of determining clusters. Identification data is generated for the clusters. The identification data comprises identifications for each cluster that uniquely identifies a respective cluster. The identifications are at least smaller than the sequences of the data set, which means that they can be stored by a fewer number of bits than each sequence of the data set. This method results in a smaller set of data and storage capacity is saved. In an embodiment, the average size of the identifications is minimized given the condition that each cluster must be uniquely identifiable.

Optionally, one of the above discussed methods of determining clusters may be part of a method of transmitting compacted data comprising at least one sequence of instances of the first type of data. The at least one sequence is a sequence to be transmitted. The method comprises obtaining at least one sequence. After determining the clusters, one of the clusters is selected as the cluster that best matches with the at least one sequence. It may be that the first set of data X that is being used in the method of determining clusters already comprises a sequence that is equal to the at least one sequence and then the cluster is selected to which the sequence was assigned. It may also be that the first set of data X does not comprise a sequence that is equal to the at least one sequence and then a cluster is selected that best matches the at least one sequence. For example, each cluster may be represented by a representative sequence (which is, for example, a central sequence in the space that is represented by the cluster) and the cluster is selected of which the representative sequence is at a shortest distance to the at least one sequence. For the clusters identification data is generated. The identification data comprises identifications for each cluster that uniquely identifies a respective cluster. The identifications are at least smaller than the sequences of the data set, which means that they can be stored by a fewer number of bits than each sequence of the data set. Subsequently, an identification data of the selected cluster is transmitted instead of the at least one sequence. Thereby a smaller amount of bits are transmitted compared to the situation that the whole at least one sequence had to be transmitted and transmission bandwidth and transmission power is saved.

Figure 4:
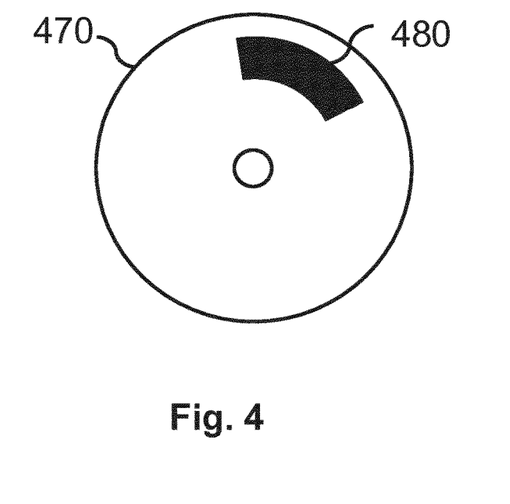

FIG. 4 schematically shows an embodiment of a computer program product 470 which program is operative to cause a processor to perform one of the previously discussed methods, such as one of the embodiments of the method 200 of determining cluster, the method of transmitting compacted data or the method of compacting a data set. Embodiments also extends to computer program products 470, particularly computer programs 480 on or in a carrier 470, adapted for putting the invention into practice. The computer program product may comprises a computer program 480. The program may be in the form of source code, object code, a code intermediate source and object code such as partially compiled form, or in any other form suitable for use in the implementation of the one of the above discussed methods. It will also be appreciated that such a program may have many different architectural designs. For example, a program code implementing the functionality of the method or device may be subdivided into one or more subroutines. Many different ways to distribute the functionality among these subroutines will be apparent to the skilled person. The subroutines may be stored together in one executable file to form a self-contained program. Such an executable file may comprise computer executable instructions, for example processor instructions and/or interpreter instructions (e.g. Java interpreter instructions). Alternatively, one or more or all of the subroutines may be stored in at least one external library file and linked with a main program either statically or dynamically, e.g. at run-time. The main program contains at least one call to at least one of the subroutines. Also, the subroutines may comprise function calls to each other. An embodiment relating to a computer program product 470 comprises computer executable instructions 480 corresponding to each of the processing steps of at least one of the methods set forth. These instructions may be subdivided into subroutines and/or be stored in one or more files that may be linked statically or dynamically. Another embodiment relating to a computer program product 470 comprises computer executable instructions 480 corresponding to each of the means of at least one of the systems and/or products set forth. These instructions may be subdivided into subroutines and/or be stored in one or more files that may be linked statically or dynamically.

The carrier of a computer program may be any entity or device capable of carrying the program. For example, the carrier may include a storage medium, such as a ROM, for example a CD ROM or a semiconductor ROM, or a magnetic recording medium, for example a floppy disc or hard disk. Further the carrier may be a transmissible carrier such as an electrical or optical signal, which may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

The computer program 480 may be a computer program for a distributed processor system and may comprise computer code which causes a first processor system to perform a subset of the steps of the above discussed method and which causes a second processor system to perform another subset of the steps of the above discussed method. The subset of steps and the another subset of steps may be mutually exclusive.

In summary, this document provides a device for and method of determining clusters of sequences of instances of a first type of data for compacting a data set comprising sequences of instances of the first type of data is provided. Also a method of compacting a data set, a method of transmitting compacted data and a computer program product are provided. In a sequence clustering unit of the device, sequences of a first set of data are clustered on basis of conditional probabilities. Each unique sequence of the first set of data is associated with one or more conditional probabilities that an instance of the second set of data has a specific value given the unique sequence. In the clustering a significant part of the mutual information between the first set of data and the second set of data is maintained.

It is to be noted that the invention may be implemented in hardware and/or software, using programmable components.

It will be appreciated that the above description for clarity has described embodiments of the invention with reference to different functional units and processors. However, it will be apparent that any suitable distribution of functionality between different functional units or processors may be used without deviating from the invention. For example, functionality illustrated to be performed by separate units, processors or controllers may be performed by the same processor or controllers. Hence, references to specific functional units are only to be seen as references to suitable means for providing the described functionality rather than indicative of a strict logical or physical structure or organization. The invention can be implemented in any suitable form including hardware, software, firmware or any combination of these.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software, and a processor may fulfill the function of one or more units, possibly in cooperation with hardware elements. Further, the invention is not limited to the embodiments, and the invention lies in each and every novel feature or combination of features described above or recited in mutually different dependent claims.

The invention claimed is:

1. A data reduction arrangement for compacting sequences of instances of a first type of data, the data reduction arrangement comprising:
    a device for determining clusters of sequences of instances of a first type of data for compacting a data set comprising sequences of instances of the first type of data, the instances of the first type of data comprising information for predicting instances of a second type of data, the instances of the second type of data comprising data based on a characteristic of a physical entity, the device comprising:
        a first data set unit for obtaining a first set of data comprising sequences of instances of the first type of data;
        a second data set unit for obtaining a second set of data comprising instances of the second type of data, each instance of the second set of data corresponds to a sequence in the first set of data;
        a sequence clustering unit for assigning the sequences of the first set of data to clusters, the assigning is based on conditional probabilities of data of the second type given a sequence of the first set of data, wherein each unique sequence of the first set of data is associated with one or more conditional probabilities that an instance of the second set of data has a specific value given the unique sequence, wherein the assigning of the sequences of the first set of data to clusters comprises applying the Context Tree Weighting method to the first set of data and the second set of data to obtain a context tree, in the Context Tree Weighting method every unique sequence of the first set of data is represented by a path in the context tree from a root node to a specific leaf node and counts stored in at least the leaf nodes of the context tree are based on the corresponding instances of the second set of data, wherein the estimated conditional probability of a respective leaf node is calculated on the basis of the counts of the respective leaf nodes; and
    a compaction unit configured for compacting the first data set by replacing the sequences of instances of the first type of data of the data set by an identification data of the cluster to which the sequence is assigned, wherein the identification data of a specific cluster uniquely identifies the specific cluster and is stored by a fewer number of bits than each sequence of the data set.

2. A computer-implemented method for determining clusters of sequences of instances of data of a first type of data for compacting a data set comprising sequences of instances of the first type of data, the instances of the first type of data comprising information for predicting instances of a second type of data, the instances of the second type of data comprising data being based on a characteristic of a physical entity, the method comprising:
    obtaining a first set of data comprising sequences of instances of the first type of data;
    obtaining a second set of data comprising instances of the second type of data, each instance of the second set of data corresponds to a sequence in the first set of data;
    assigning the sequences of the first set of data to clusters, the assigning is based on conditional probabilities of data of the second type given a sequence of the first set of data, wherein each unique sequence of the first set of data is associated with one or more conditional probabilities that an instance of the second set of data has a specific value given the unique sequence, wherein the assigning of the sequences of the first set of data to clusters comprises applying the Context Tree Weighting method to the first set of data and the second set of data to obtain a context tree, in the Context Tree Weighting method every unique sequence of the first set of data is represented by a path in the context tree from a root node to a specific leaf node and counts stored in at least the leaf nodes of the context tree are based on the corresponding instances of the second set of data, wherein the estimated conditional probability of a respective leaf node is calculated on the basis of the counts of the respective leaf nodes; and
    compacting the first data set by replacing the sequences of instances of the first type of data of the data set by an identification data of the cluster to which the sequence is assigned, wherein the identification data of a specific cluster uniquely identifies the specific cluster and is stored by a fewer number of bits than each sequence of the data set.

3. The method according to claim 2, wherein the assigning of the sequences of the first set of data to clusters comprises forming the cluster on basis of estimated conditional probabilities of the leaf nodes of the context tree, wherein, if a specific leaf node is related to a specific cluster, then all sequences of the first set of data equal to the unique sequence ending in the specific leaf node are assigned to the specific cluster and wherein the estimated conditional probability of a respective leaf node is a Krichevsky and Trofimov estimator that is calculated on basis of the counts of the respective leaf nodes.

4. The method according to claim 2, wherein the assigning of the sequences of the first set of data to clusters uses a k-means algorithm to form the clusters and assigns sequences of the first set to clusters, and wherein the k-means algorithm uses the estimated conditional probabilities of the leaf nodes of the context tree to form the clusters.

5. The method according to claim 4, wherein, in the assigning of the sequence of the first set of data to clusters, sequences of the first set of data ending in leaf nodes having a total count that is smaller than a minimum number of observations are assigned to two additional clusters, sequences ending in leaf nodes having an estimated conditional probability smaller than 0.5 and having a total count that is smaller than the minimum number of observations are assigned to a first one of the two additional clusters, sequences ending in leaf nodes having an estimated conditional probability larger than 0.5 and having a total count that is smaller than the minimum number of observations are assigned to a second one of the two additional clusters, sequences ending in leaf nodes having an estimated conditional probability that is equal to 0.5 and having a total count smaller than the minimum number of observations are assigned to either the first one of the additional clusters or the second one of the additional clusters.

6. The method according to claim 2, wherein the clusters of the sequences of the first set of data are further optimized by an iterative optimization method to minimize an optimization function that is based on a conditional entropy of the second set of data given the data of the clusters.

7. The method according to claim 6, wherein the iterative optimization method comprises simulated annealing.

8. The method according to claim 2, wherein the sequences of instances of the first type of data of the first set of data comprise time series of sensor data, each time series comprises results of measurements of one specific sensor at consecutive moments in time and the specific sensors are of an equal type.

9. The method according to claim 2, wherein the instances of the second set of data are binary data instances.

10. The method according to claim 9, wherein the assigning based on conditional probabilities is based on the conditional probabilities that the data of the second set of data is one given an unique sequence of the first set of data.

11. A method of transmitting compacted data comprising at least one sequence of instances of the first type of data, the at least one sequence is a sequence to be transmitted, the method comprising:
obtaining the at least one sequence;
determining, via a computer-implemented method, clusters of sequences of instances of data of a first type of data for compacting a data set comprising sequences of instances of the first type of data, the instances of the first type of data comprising information for predicting instances of a second type of data, the instances of the second type of data comprising data being based on a characteristic of a physical entity, the computer-implemented method comprising:
obtaining a first set of data comprising sequences of instances of the first type of data;
obtaining a second set of data comprising instances of the second type of data, each instance of the second set of data corresponds to a sequence in the first set of data;
assigning the sequences of the first set of data to clusters, the assigning is based on conditional probabilities of data of the second type given a sequence of the first set of data, wherein each unique sequence of the first set of data is associated with one or more conditional probabilities that an instance of the second set of data has a specific value given the unique sequence, wherein the assigning of the sequences of the first set of data to clusters comprises applying the Context Tree Weighting method to the first set of data and the second set of data to obtain a context tree, in the Context Tree Weighting method every unique sequence of the first set of data is represented by a path in the context tree from a root node to a specific leaf node and counts stored in at least the leaf nodes of the context tree are based on the corresponding instances of the second set of data, wherein the estimated conditional probability of a respective leaf node is calculated on the basis of the counts of the respective leaf nodes;
compacting the first data set by replacing the sequences of instances of the first type of data of the data set by an identification data of the cluster to which the sequence is assigned, wherein the identification data of a specific cluster uniquely identifies the specific cluster and is stored by a fewer number of bits than each sequence of the data set;
selecting one of the clusters as the cluster that best matches with the at least one sequence; and
transmitting an identification data of the selected cluster instead of the at least one sequence, the identification data of a specific cluster uniquely identifies the specific cluster and can be stored by a fewer number of bits than the sequence.

12. A non-transitory computer-readable medium having one or more executable instructions stored thereon, which when executed by a processor, cause the processor to perform a computer-implemented method for determining clusters of sequences of instances of data of a first type of data for compacting a data set comprising sequences of instances of the first type of data, the instances of the first type of data comprising information for predicting instances of a second type of data, the instances of the second type of data comprising data being based on a characteristic of a physical entity, the method comprising:
obtaining a first set of data comprising sequences of instances of the first type of data;
obtaining a second set of data comprising instances of the second type of data, each instance of the second set of data corresponds to a sequence in the first set of data;
assigning the sequences of the first set of data to clusters, the assigning is based on conditional probabilities of data of the second type given a sequence of the first set of data, wherein each unique sequence of the first set of data is associated with one or more conditional probabilities that an instance of the second set of data has a specific value given the unique sequence, wherein the assigning of the sequences of the first set of data to clusters comprises applying the Context Tree Weighting method to the first set of data and the second set of data to obtain a context tree, in the Context Tree Weighting method every unique sequence of the first set of data is represented by a path in the context tree from a root node to a specific leaf node and counts stored in at least the leaf nodes of the context tree are based on the corresponding instances of the second set of data, wherein the estimated conditional probability of a respective leaf node is calculated on the basis of the counts of the respective leaf nodes; and compacting the first data set by replacing the sequences of instances of the first type of data of the data set by an identification data of the cluster to which the sequence is assigned, wherein the identification data of a specific cluster uniquely identifies the specific cluster and is stored by a fewer number of bits than each sequence of the data set.

* * * * *